(12) United States Patent
Park et al.

(10) Patent No.: US 11,665,917 B2
(45) Date of Patent: May 30, 2023

(54) DC GENERATION ENERGY HARVESTING SYSTEM AND MANUFACTURING METHOD THEREOF

(71) Applicant: RESEARCH & BUSINESS FOUNDATION SUNGKYUNKWAN UNIVERSITY, Suwon-si (KR)

(72) Inventors: Nam-Gyu Park, Suwon-si (KR); Ma Chunqing, Suwon-si (KR); Yeon Woo Choi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/405,320

(22) Filed: Aug. 18, 2021

(65) Prior Publication Data
US 2022/0059785 A1 Feb. 24, 2022

(30) Foreign Application Priority Data
Aug. 21, 2020 (KR) .................. KR10-2020-0105093

(51) Int. Cl.
*H10K 30/82* (2023.01)
*H01L 31/0224* (2006.01)

(52) U.S. Cl.
CPC ..... *H10K 30/82* (2023.02); *H01L 31/022425* (2013.01); *H01L 31/022466* (2013.01); *H10K 71/12* (2023.02)

(58) Field of Classification Search
CPC ........... H01L 51/442; H01L 31/022425; H01L 31/022466; H10K 30/82
See application file for complete search history.

(56) References Cited

U.S. PATENT DOCUMENTS

2016/0133672 A1* 5/2016 Koposov ................ H10K 30/10
136/255
2018/0114648 A1* 4/2018 Qi ....................... H01L 51/0032
2018/0211792 A1* 7/2018 Mori .................... H01G 9/0029

FOREIGN PATENT DOCUMENTS

KR 10-2018-0129132 A 12/2018

OTHER PUBLICATIONS

Su, et al. "Photoinduced enhancement of a triboelectric nanogenerator based on an organolead halide perovskite." *Journal of Materials Chemistry C* vol. 4 Issue 43 (Oct. 5, 2016): pp. 10395-10399.
Wang, et al. "The unique dielectricity of inorganic perovskites toward high-performance triboelectric nanogenerators." *Nano Energy* vol. 69 (Mar. 2020): pp. 1-10.
Kim, et al. "Piezoelectric properties of $CH_3NH_3PbI_3$ perovskite thin films and their applications in piezoelectric generators." *Journal of Materials Chemistry A* vol. 4 Issue 3 (2016): pp. 756-763.
Korean Office Action dated Feb. 23, 2022 in corresponding Korean Patent Application No. 10-2020-0105093 (6 pages in Korean).

* cited by examiner

*Primary Examiner* — Golam Mowla
(74) *Attorney, Agent, or Firm* — NSIP Law

(57) ABSTRACT

An energy harvesting system for generating electrical energy, includes a first substrate, a perovskite layer formed on the first substrate, a charge transport layer disposed on the perovskite layer, and the charge transport layer being configured to slide over the perovskite layer, and a second substrate formed on the charge transport layer.

11 Claims, 24 Drawing Sheets

[FIG. 1]
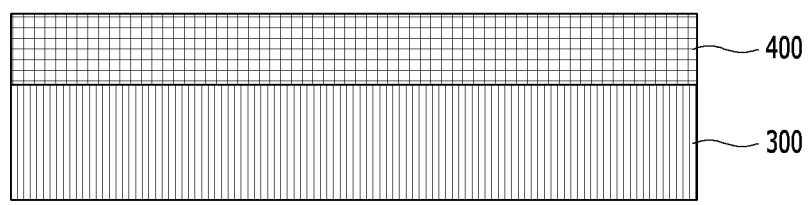
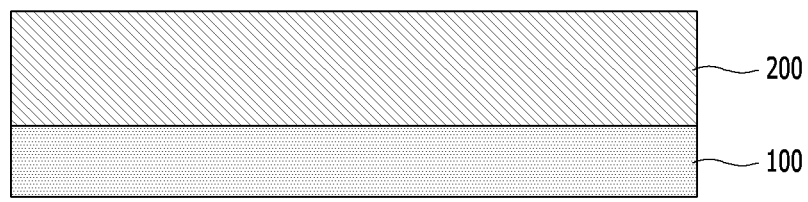

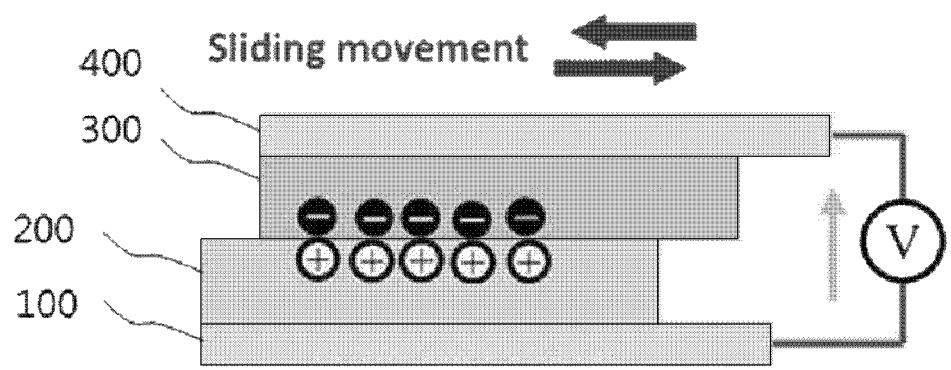
[FIG. 2]

[FIG. 3]
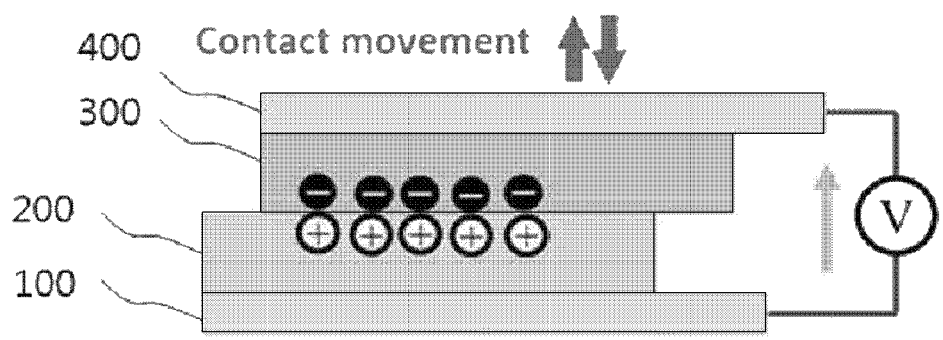

[FIG. 4]
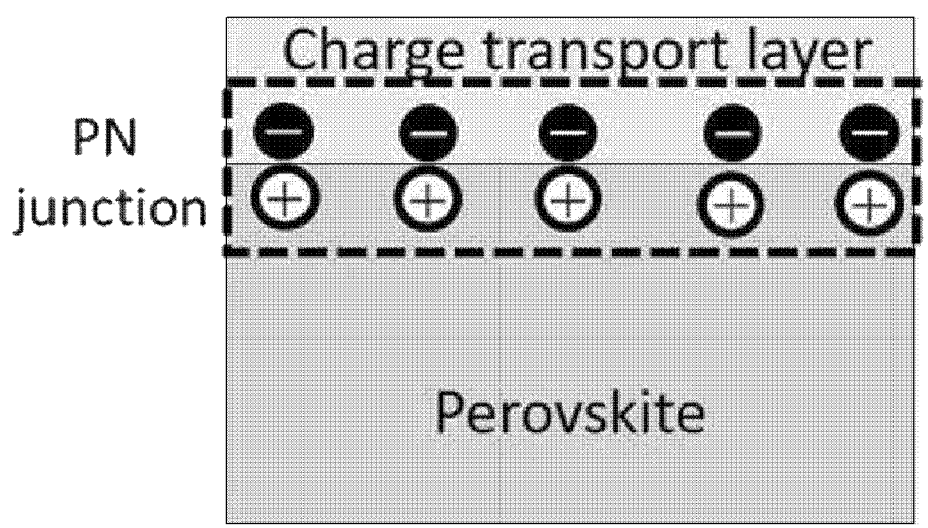

[FIG. 5]
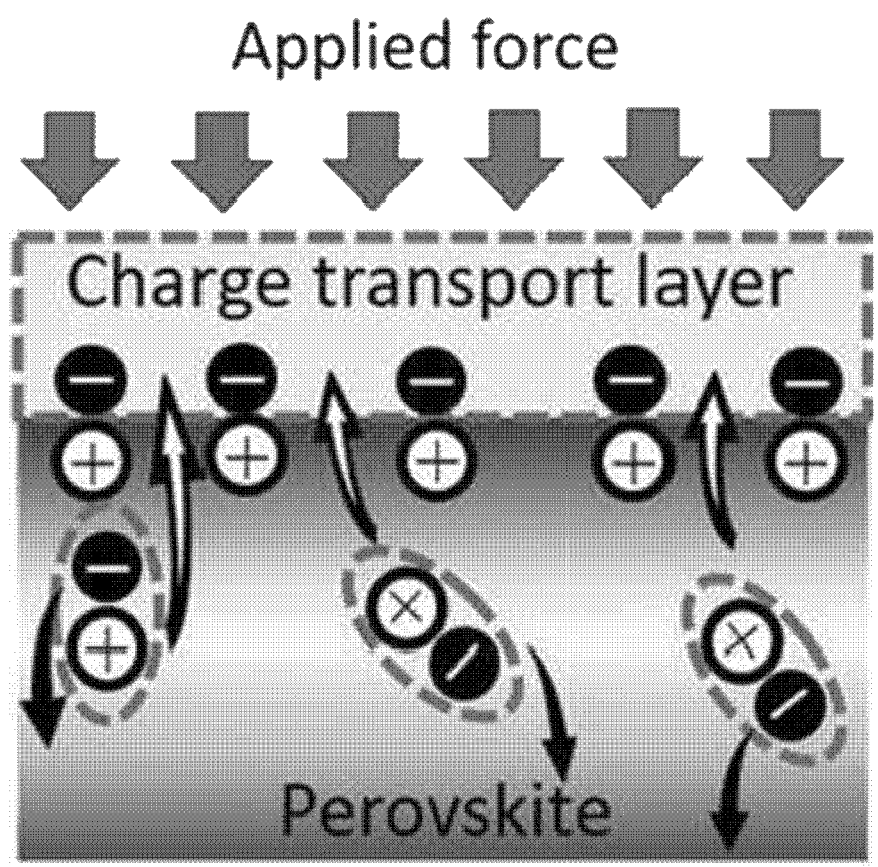

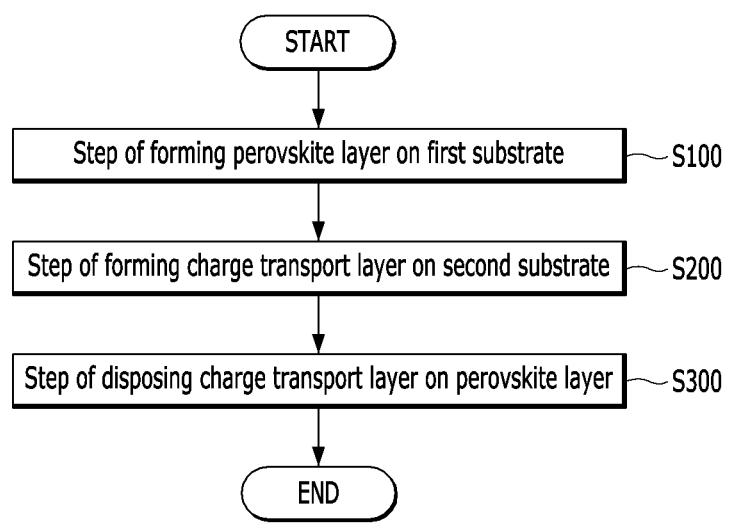
[FIG. 6]

[FIG. 7A]
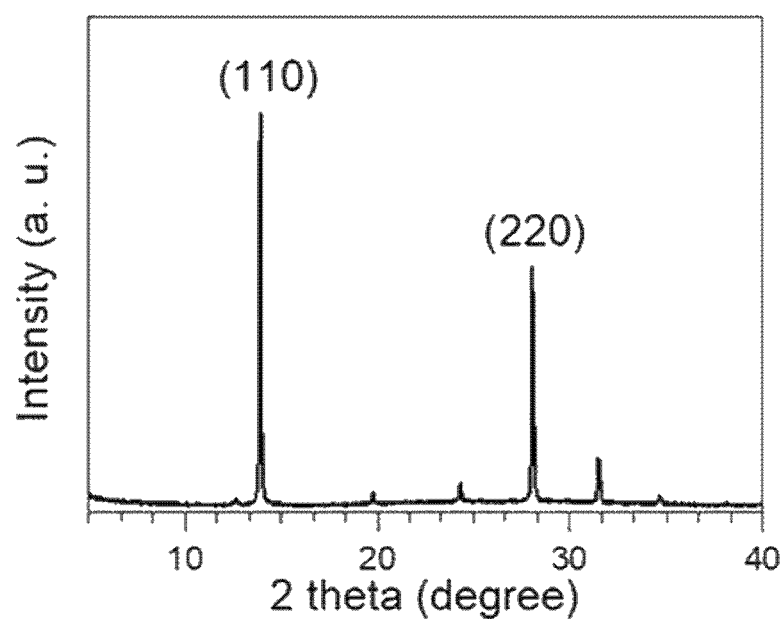

[FIG. 7B]
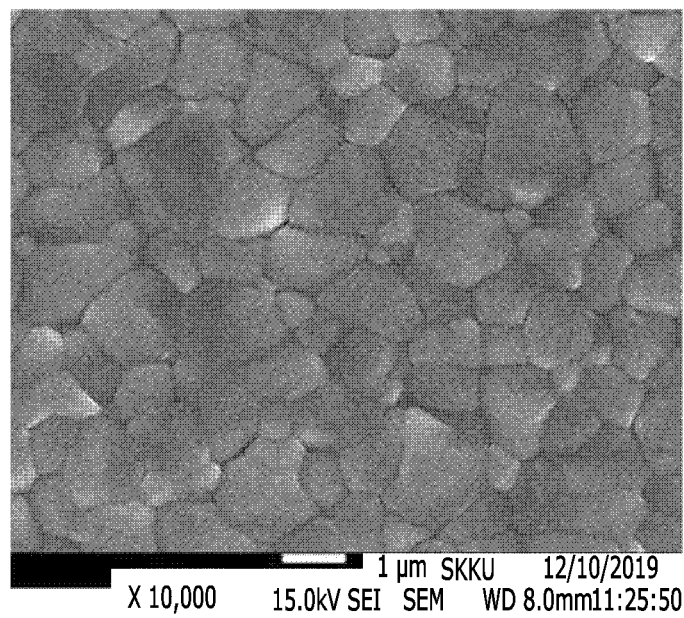

[FIG. 7C]
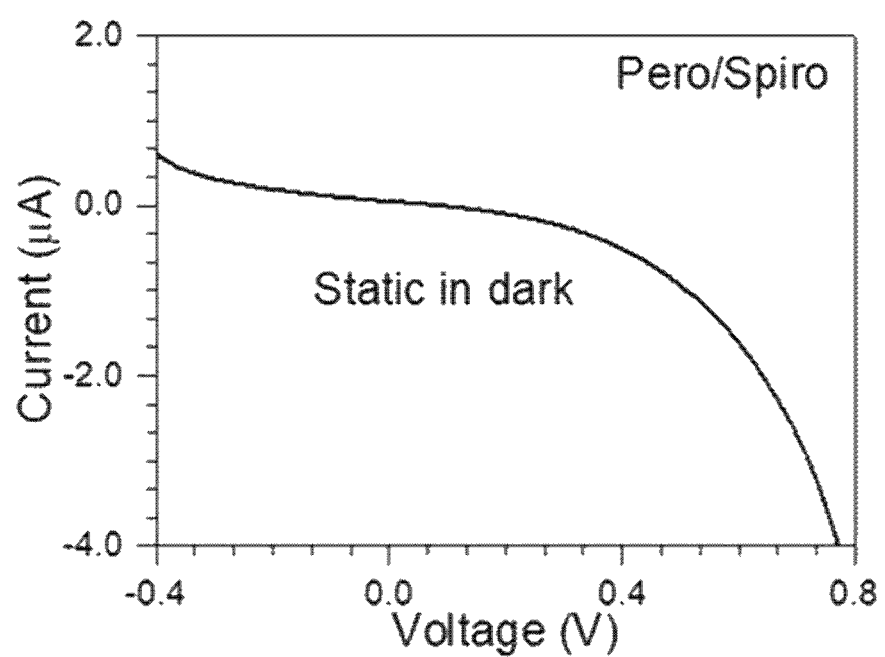

[FIG. 8]
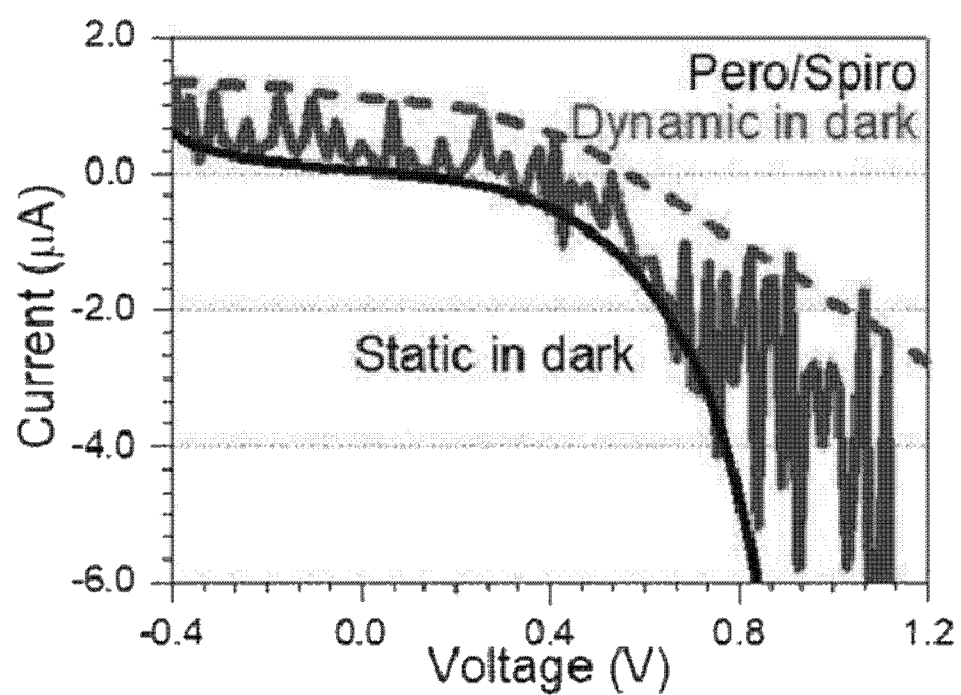

[FIG. 9]
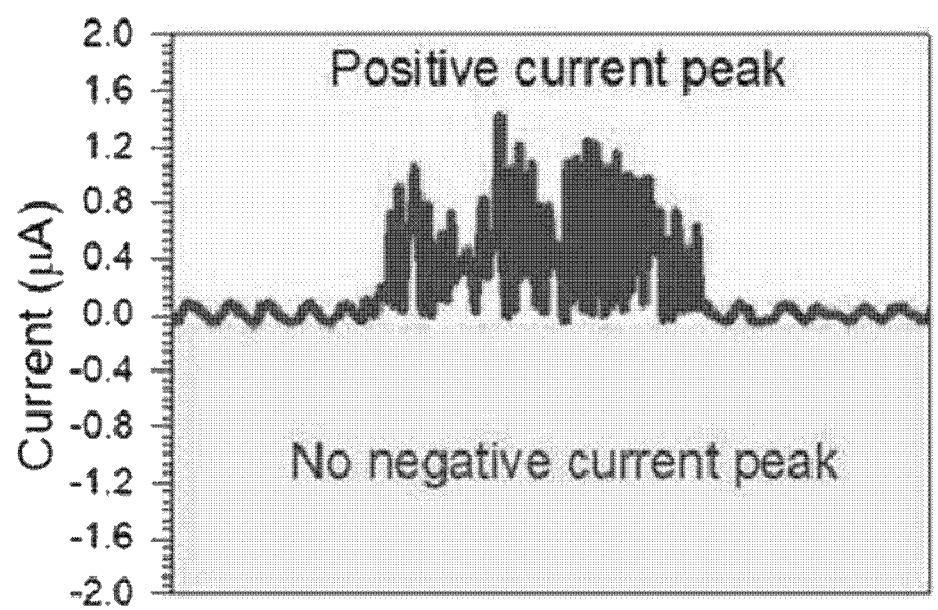

[FIG. 10]
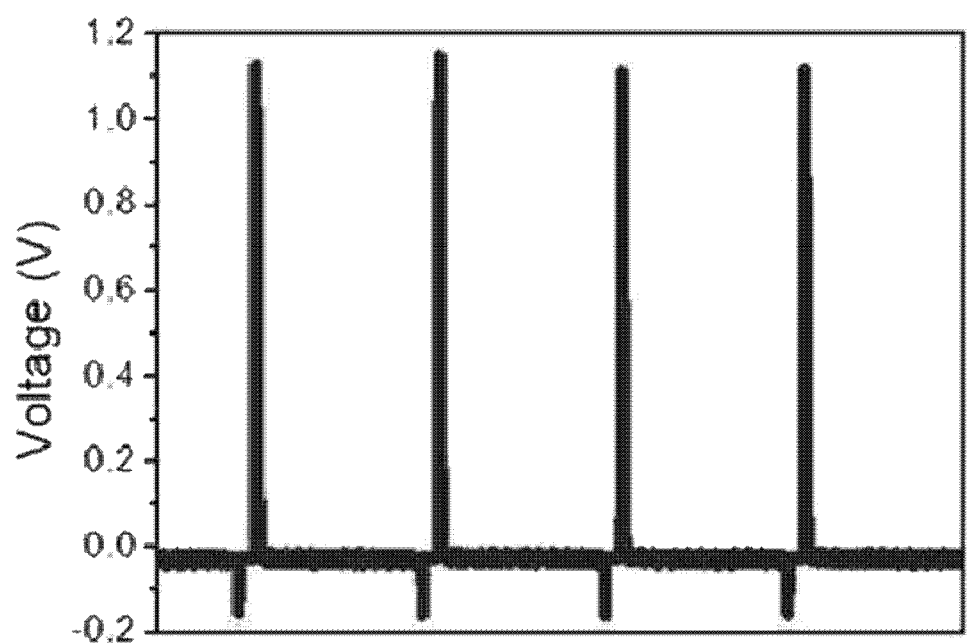

[FIG. 11]
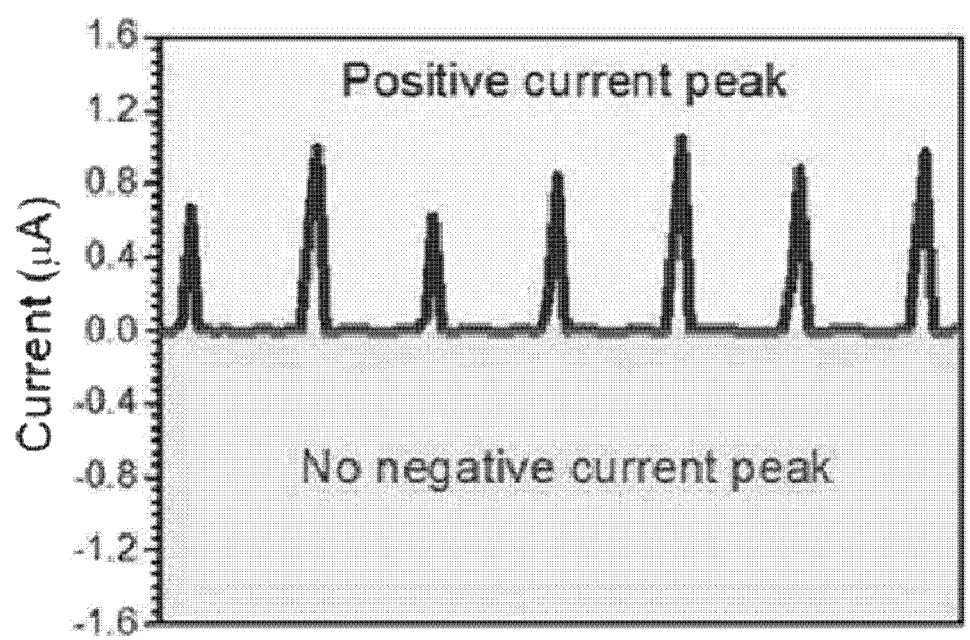

[FIG. 12]
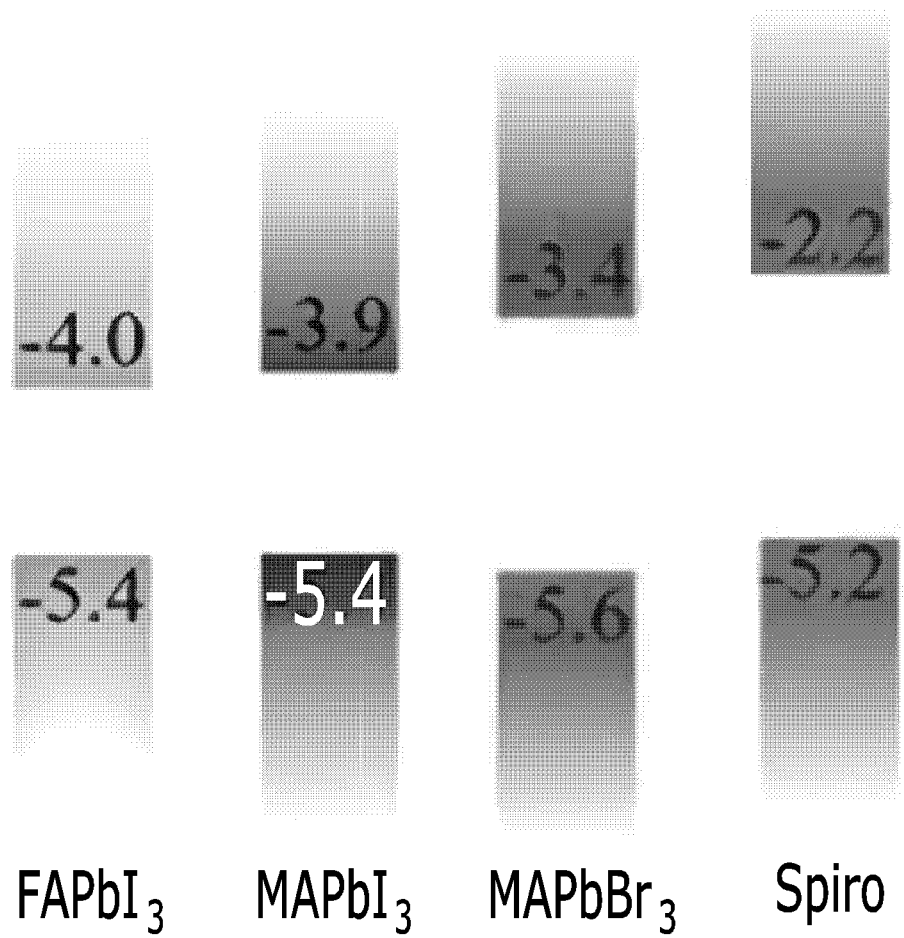

[FIG. 13]
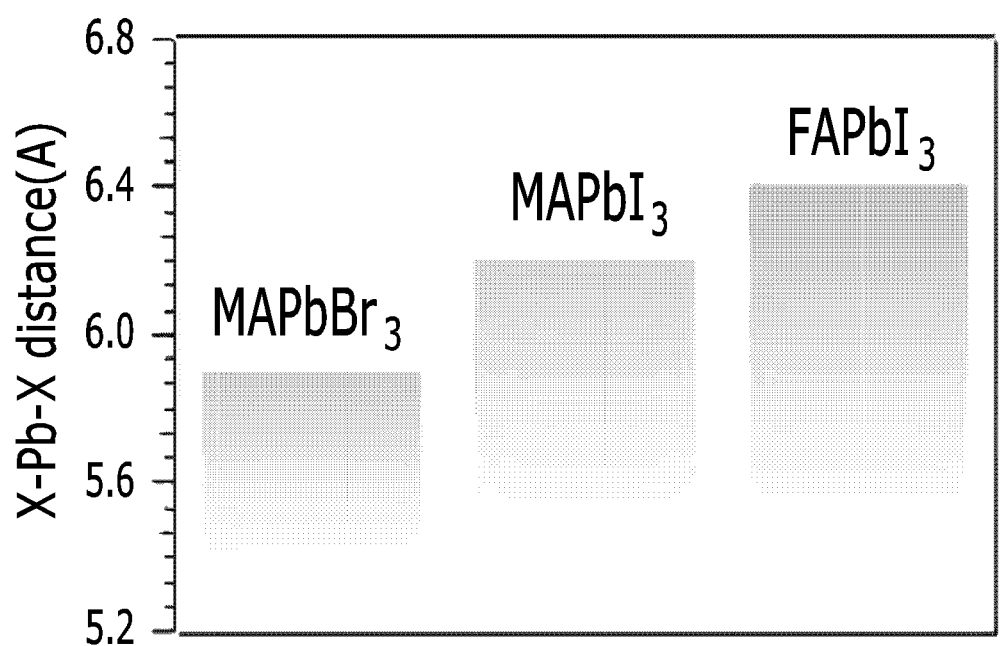

[FIG. 14]
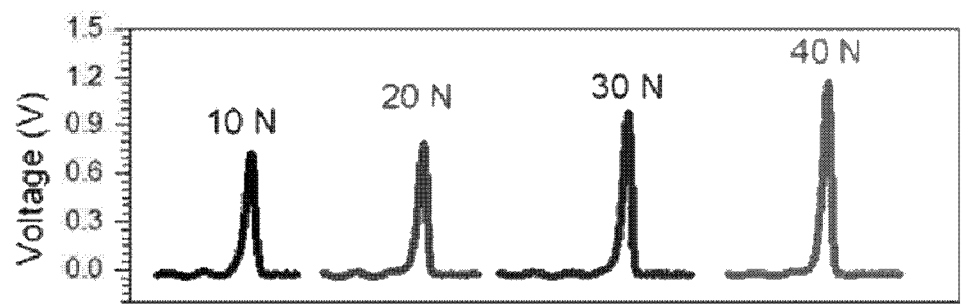

[FIG. 15]
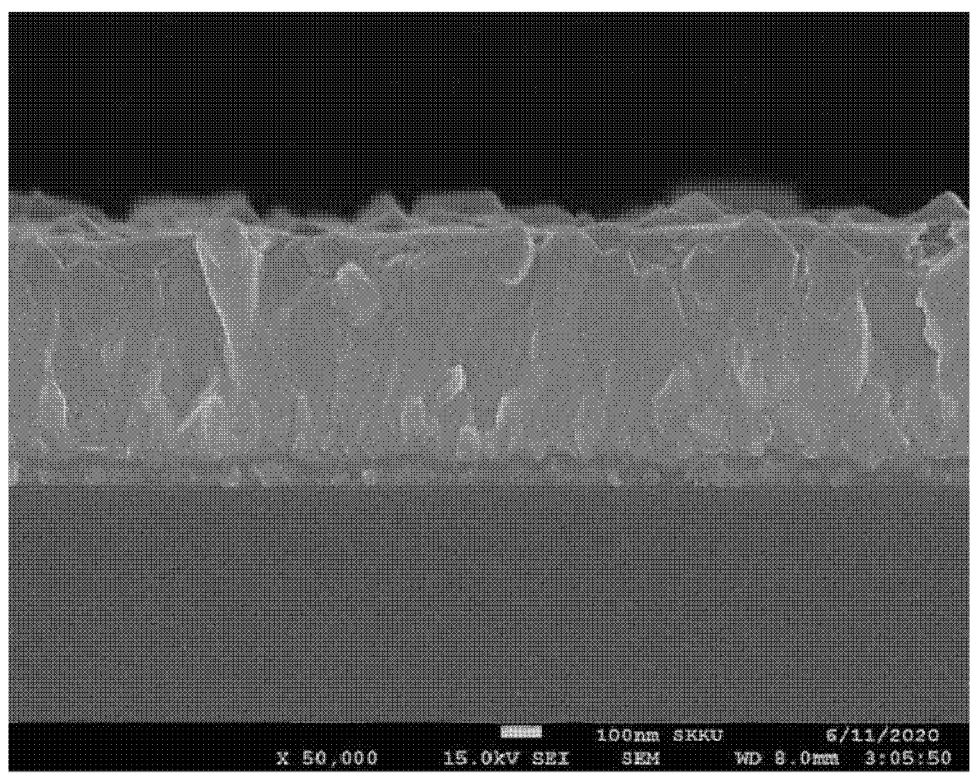

[FIG. 16]
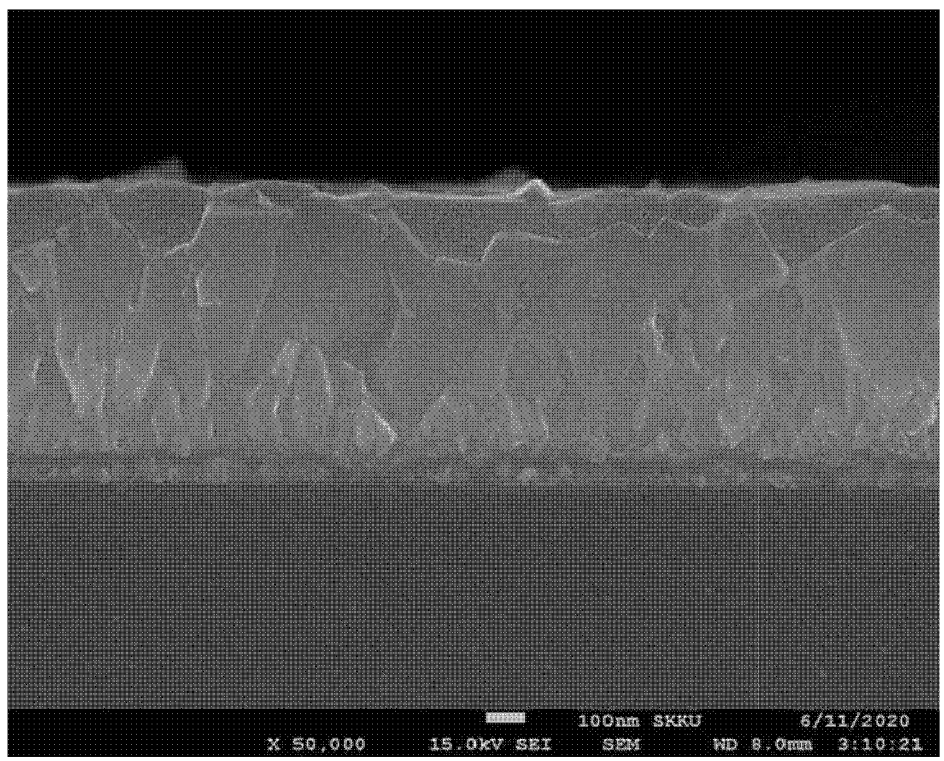

[FIG. 17]
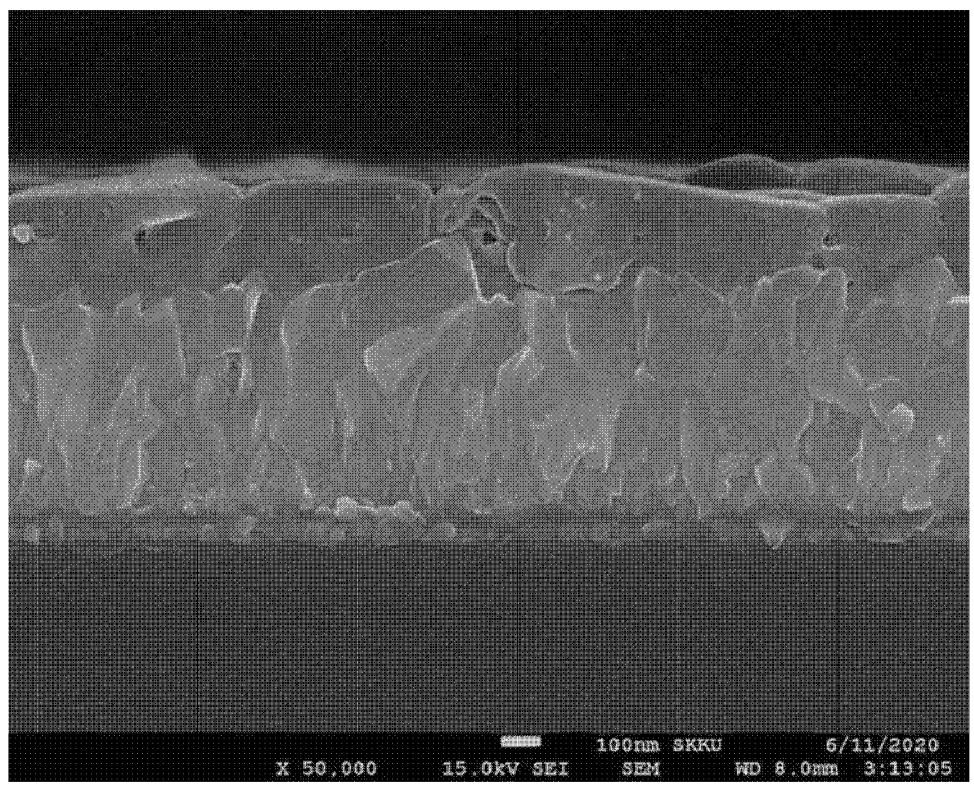

[FIG. 18]
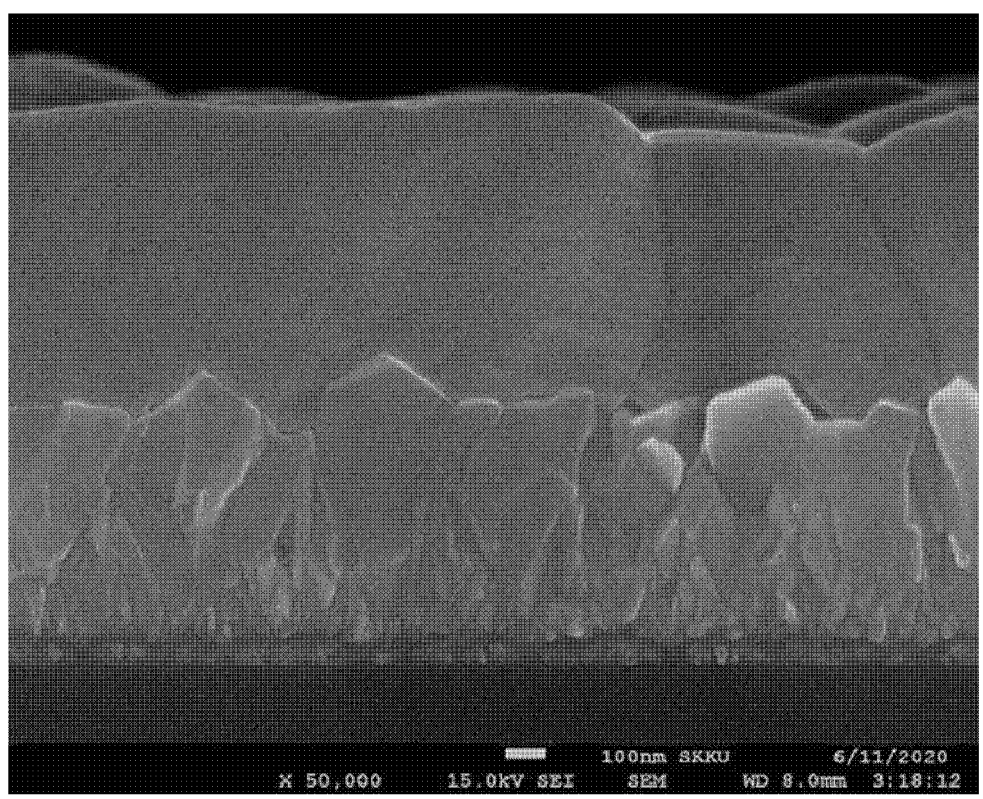

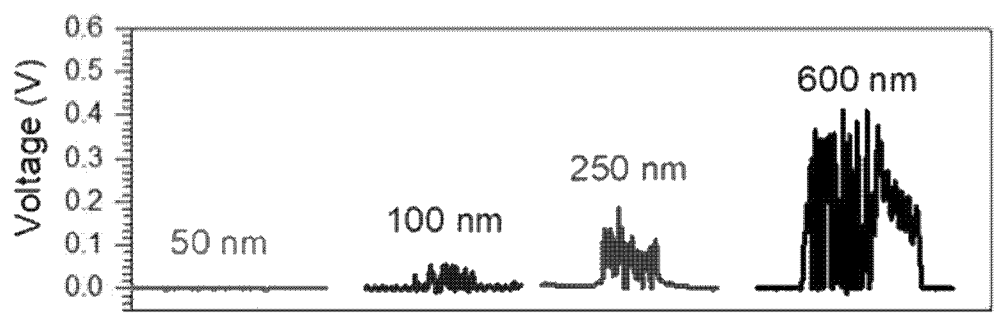
[FIG. 19]

[FIG. 20]
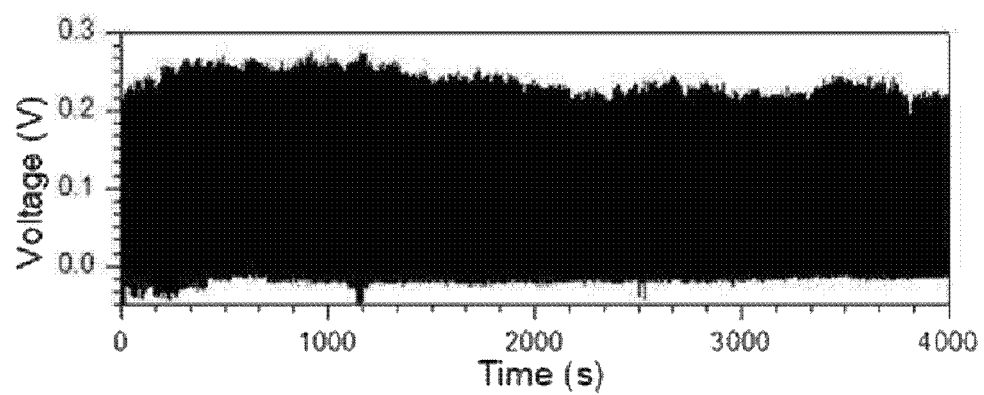

[FIG. 21]
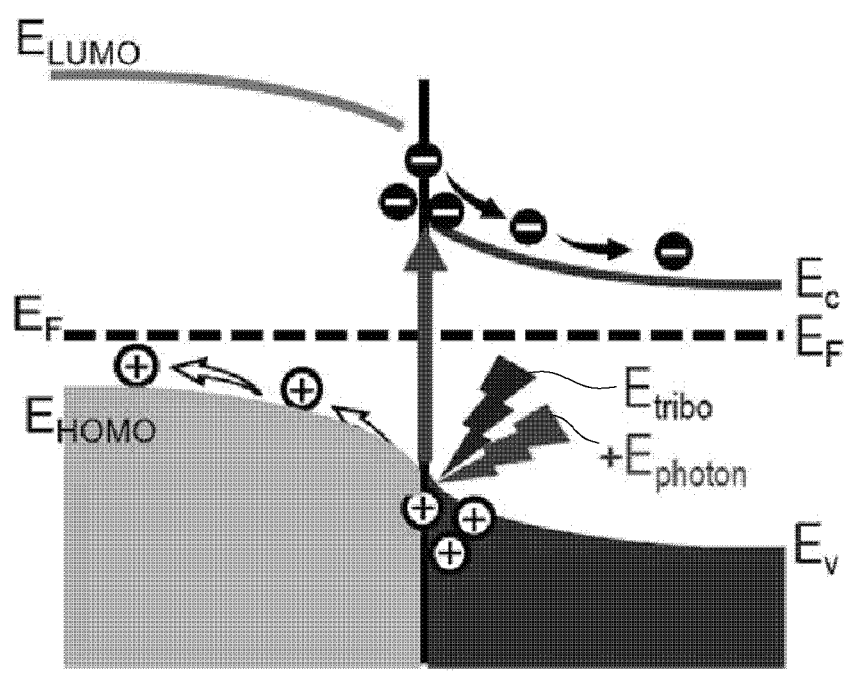

[FIG. 22]
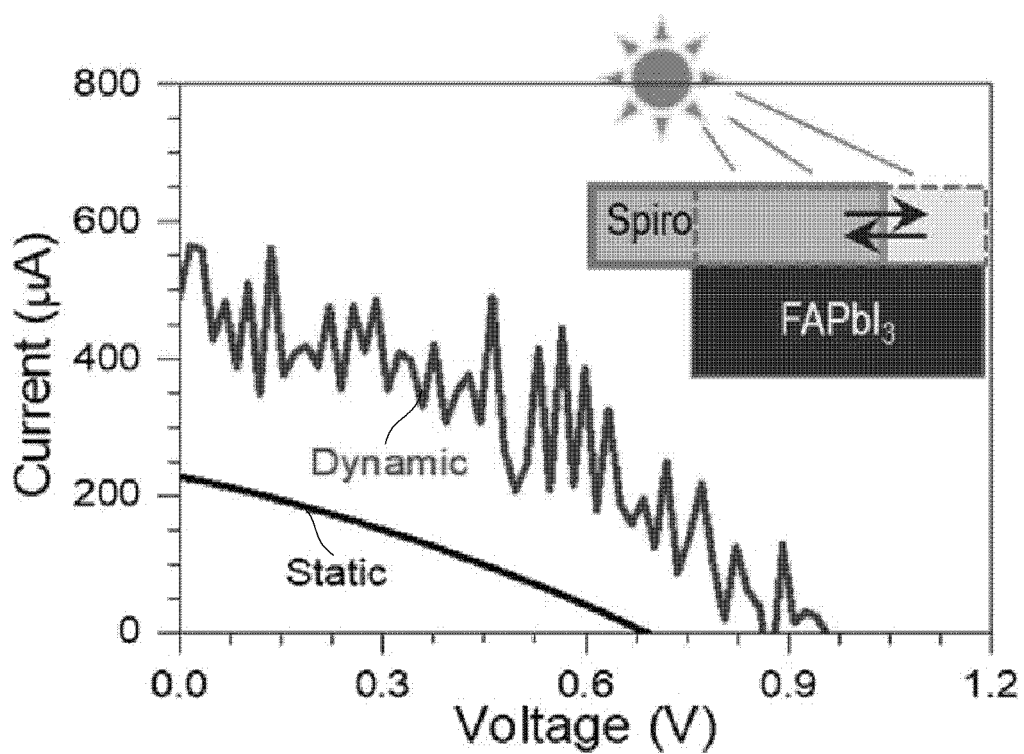

DC GENERATION ENERGY HARVESTING SYSTEM AND MANUFACTURING METHOD THEREOF

CROSS-REFERENCE TO RELATED APPLICATIONS

This application claims the benefit under 35 USC 119(a) of Korean Patent Application No. 10-2020-0105093 filed on Aug. 21, 2020, in the Korean Intellectual Property Office, the entire disclosure of which is incorporated herein by reference for all purposes.

BACKGROUND

1. Field

The present application relates to a dc generation energy harvesting system and manufacturing method thereof.

2. Description of the Related Art

Energy harvesting refers to a technology that collects wasted energy and utilizes it as electricity. Currently, efforts are being made to convert natural energy and all energy sources wasted around us into electrical energy.

As one of the energy harvesting technologies, a generation element that converts existing mechanical and optical energy into electrical energy at the same time was a simple combined form of single elements capable of converting different energies. Mechanical energy (vibration)/optical energy (light), which are heterogeneous energy sources generated in daily life, have often been generated simultaneously, and most of them have been thrown away without being converted into electrical energy. An energy harvester that collects mechanical energy (vibration) converts it into electrical energy based on triboelectrification and piezoelectric phenomenon, but triboelectrification causes durability problems to occur on the surface, and the conversion of electrical energy based on the piezoelectric phenomenon has been very limited. Meanwhile, an energy harvester that collects optical energy (light) converts it into electrical energy based on solar electricity, but the energy harvester is affected by the weather and is translucent so that there is a limit to installation on the window side.

Further, existing systems for converting mechanical energy into electrical energy mainly generate AC power, and there has hardly been any report on DC power generation. Such existing systems have required a rectifier to convert the generated alternating current into direct current and have had limitations in generating low current density (0.01 $Am^{-2}$ to 0.1 $Am^{-2}$).

Korean Patent Publication No. 10-2018-0129132, which is the background technology of the present application, relates to a hybrid energy generator using quantum dots having a perovskite structure. Although the published patent discloses a technology of converting mechanical/optical energy into electrical energy, it does not disclose the generation of a direct current by the junction of a dynamic perovskite photovoltaic cell.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an energy harvesting system for generating electrical energy, includes a first substrate, a perovskite layer formed on the first substrate, a charge transport layer disposed on the perovskite layer, and the charge transport layer being configured to slide over the perovskite layer, and a second substrate formed on the charge transport layer.

The perovskite layer and the charge transport layer may form a PN junction.

The electrical energy may be generated by friction occurring as the perovskite layer slides over the charge transport layer.

The electrical energy may be generated by pressure applied vertically on the perovskite layer and the charge transport layer.

The electrical energy may be generated as the perovskite layer's crystal structure is changed by the pressure.

The perovskite layer may include a material having a chemical formula of $ABX_3$ or $A_2BX_4$, where A is a $C_1$-$C_{24}$ substituted or unsubstituted alkyl group, and when the A is substituted, the substituent is an amino group, a hydroxyl group, a cyano group, a halogen group, a nitro group, or a methoxy group, B includes a metal cation selected from the group consisting of Pb, Bi, Sn, Ge, Cu, Ni, Co, Fe, Mn, Cr, Pd, Cd, Yb, and combinations thereof, and X includes a halide anion or a chalcogenide anion.

An amount of the electrical energy generated, depending on a work function difference between the perovskite layer and the charge transport layer, maybe adjustable.

An amount of electrical energy generated, depending on a thickness of the perovskite layer, may be adjustable.

Each of the first substrate and the second substrate may include one selected from the group consisting of glass, $SiO_2$, ITO, FTO, Si, SiC, Ga, SiGe, $Al_2O_3$, InAs, GaAs, InP, GaN, InGaAs, InAlAs, GaSb, AlSb, AlP, GaP, $Ge_2O_3$, and combinations thereof.

The charge transport layer may include one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof.

A perovskite solar cell may inlcude the energy harvesting system above.

In another general aspect, a method for manufacturing an energy harvesting system, includes forming a perovskite layer on a first substrate, forming a charge transport layer on a second substrate, and disposing the charge transport layer to be slidable on the perovskite layer.

The forming of the perovskite layer may be performed by a method selected from the group consisting of spin coating, bar coating, inkjet printing, nozzle printing, spray coating, slot die coating, gravure printing, screen printing, electrohydrodynamic jet printing, electrospray, and combinations thereof.

The forming of the charge transport layer may be performed by a method selected from the group consisting of spin coating, bar coating, inkjet printing, nozzle printing, spray coating, slot die coating, gravure printing, screen printing, electrohydrodynamic jet printing, electrospray, and combinations thereof.

Other features and aspects will be apparent from the following detailed description, the drawings, and the claims.

BRIEF DESCRIPTION OF DRAWINGS

FIG. 1 is a schematic diagram of an energy harvesting system according to an embodiment of the present application.

FIG. 2 is a conceptual diagram of the operation of an energy harvesting system according to an embodiment of the present application.

FIG. 3 is a conceptual diagram of the operation of an energy harvesting system according to an embodiment of the present application.

FIG. 4 is a conceptual diagram of the PN junction of a perovskite layer and a charge transport layer of an energy harvesting system according to an embodiment of the present application.

FIG. 5 is a conceptual diagram for one-way transport of a carrier in an energy harvesting system according to an embodiment of the present application.

FIG. 6 is a flowchart of a method for manufacturing an energy harvesting system according to an embodiment of the present application.

FIG. 7A is an X-ray diffraction (XRD) analysis result of the perovskite layer according to an embodiment of the present application.

FIG. 7B is a scanning electron microscope (SEM) image of the perovskite layer according to an embodiment of the present application.

FIG. 7C is a dark current-voltage curve obtained by performing a static PN junction of the perovskite layer and the charge transport layer in an energy harvesting system according to an embodiment of the present application.

FIG. 8 is a dark current-voltage curve graph of the dynamic movement and the static state of an energy harvesting system according to an embodiment of the present application.

FIG. 9 is a graph for the dynamic current output of an energy harvesting system according to an embodiment of the present application.

FIG. 10 is a graph for the dynamic voltage output of an energy harvesting system according to an embodiment of the present application.

FIG. 11 is a graph for the dynamic current output of an energy harvesting system according to an embodiment of the present application.

FIG. 12 is a diagram showing the level of an electron energy band of the perovskite layer of an energy harvesting system according to an embodiment of the present application.

FIG. 13 is a diagram illustrating a distance between X—Pb—X through XRD data analysis of an energy harvesting system according to an embodiment of the present application.

FIG. 14 is a diagram illustrating a voltage output at a perovskite layer/charge transport layer junction depending on a force applied in an energy harvesting system according to an embodiment of the present application.

FIGS. 15 to 18 are SEM images according to thicknesses (50/100/250/600 nm in order) of the perovskite layers of an energy harvesting system according to an embodiment of the present application.

FIG. 19 is a diagram illustrating a voltage output depending on the thickness of the perovskite layer when the same force is applied in an energy harvesting system according to an embodiment of the present application.

FIG. 20 is a long-term driving stability test result of an energy harvesting system according to an embodiment of the present application.

FIG. 21 is a schematic diagram of charge transfer during frictional motion on a device under light according to an embodiment of the present application.

FIG. 22 is a current-voltage curve graph of the dynamic movement and the static state of an energy harvesting system under light according to an embodiment of the present application.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

When unique manufacture and material allowable errors of numerical values are suggested to mentioned meanings of terms of degrees used in the present specification such as "about", "substantially", etc., the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, throughout the specification of the present application, "a step to do ~" or "a step of ~" does not mean "a step for ~".

Throughout the specification of the present application, a term of "a combination thereof" included in a Markush type expression, which means a mixture or combination of one or more selected from the group consisting of constituent elements described in the Markush type expression, means including one or more selected from the group consisting of the constituent elements.

Hereinafter, an energy harvesting system according to the present application and a method for manufacturing the same will be described in detail with reference to implementations, embodiments, and drawings. However, the present application is not limited to these implementations, embodiments, and drawings.

As a technical means for achieving the above-mentioned technical tasks, a first aspect of the present application provides an energy harvesting system for generating electrical energy, the energy harvesting system including: a first substrate; a perovskite layer which is formed on the first substrate; a charge transport layer which is disposed on the perovskite layer and is separable from the perovskite layer; and a second substrate which is formed on the charge transport layer.

An energy harvesting system according to the present application may provide a technology for effectively converting vibration (friction), pressure, sunlight, etc. into electrical energy.

An object of the present application may provide a perovskite solar cell including the energy harvesting system.

The energy harvesting system according to the present application may produce direct current differently from an existing harvesting technology by allowing a perovskite layer and a charge transport layer to form a PN junction, and enabling holes and electrons to be transported to a P-type layer and an N-type layer respectively in one direction. The direction of the current is determined by the band alignment aspect of a heterojunction of two material layers.

The energy harvesting system according to the present application may generate electrical energy by friction occurring as the perovskite layer and the charge transport layer slide with each other or by a pressure acting vertically on the perovskite layer.

The energy harvesting system according to the present application may stably output a constant voltage even if the mechanical force is repeatedly and continuously applied.

FIG. 1 is a schematic diagram of an energy harvesting system according to an embodiment of the present application. Referring to FIG. 1, it may be confirmed that a perovskite layer 200 is formed on a first substrate 100, and a charge transport layer 300 is formed on a second substrate 400. The charge transport layer 300 formed on the second substrate 400 is disposed above the perovskite layer 200 to face and be separated from each other.

According to an embodiment of the present application, although electrical energy may be generated by friction occurring as the perovskite layer 200 and the charge transport layer 300 slide relative to each other, the present application is not limited thereto.

FIG. 2 is a conceptual diagram of the operation of an energy harvesting system according to an embodiment of the present application. Referring to FIG. 2, it shows that friction occurs by sliding the perovskite layer 200 in a state where the perovskite layer 200 and the charge transport layer 300 form a junction to each other and carrier separated at the interface, which can generate electrical energy.

According to an embodiment of the present application, although electrical energy may be generated by a triboelectric effect between the junction on the perovskite layer 200 and the charge transport layer 300, the present application is not limited thereto.

FIG. 3 is a conceptual diagram for the operation of an energy harvesting system according to an embodiment of the present application. Referring to FIG. 3, it shows that when the perovskite layer 200 and the charge transport layer 300 are compressed, they receive opposing pressures at the contact interface with each other that is converted into electrical energy.

According to an embodiment of the present application, although electrical energy may be generated as the crystal structure of the perovskite layer is changed by a pressure applied vertically on the perovskite layer 200 and the charge transport layer 300 (piezoelectric and electrostrictive effects), the present application is not limited thereto.

Specifically, the energy harvesting system according to the present application may output a voltage as the distance between a metal material B (e.g., Pb) and a halogen material X, that is, the separation distance between X—Pb—X changes in a perovskite structure, for example, $ABX_3$ or $A_2BX_4$ structure by the pressure.

According to an embodiment of the present application, although the perovskite layer 200 and the charge transport layer 300 may form a PN junction, the present application is not limited thereto.

FIG. 4 is a conceptual diagram of the PN junction of the perovskite layer 200 and the charge transport layer 300 of an energy harvesting system according to an embodiment of the present application.

According to the present application, the energy harvesting system may produce a direct current differently from the existing technology since the perovskite layer 200 and the charge transport layer 300 form the PN junction.

Referring to FIG. 4, when a horizontal or vertical pressure is applied to the energy harvesting system according to the present application, the perovskite layer 200 acts as an N-type semiconductor. On the other hand, the charge transport layer 300 acts as a P-type semiconductor. Alternatively, it is also possible that the perovskite layer 200 acts as a P-type semiconductor, and the charge transport layer 300 acts as an N-type semiconductor. Since it is possible to transport the holes to the P-type layer and the electrons to the N-type layer in one direction by forming the PN junction in this way, it is possible to produce a direct current differently from the existing harvesting technology. The direction of the current is determined by the band alignment aspect of the heterojunction of two material layers.

Specifically, N-type free electrons at the junction are attracted to P-type holes. Similarly, P-type holes are attracted to the N-type free electrons. The positively charged donor dopant atoms of N-type may not move since they are part of the crystal. Therefore, the region near the junction in N-type becomes positively charged. P-type negatively charged acceptor, dopant atoms are part of the crystal and may not move. Therefore, the region near the junction in P-type becomes negatively charged.

For example, when a horizontal force is applied to the energy harvesting system according to the present application (refer to FIG. 2), electrons and holes are generated by friction occurring between the perovskite layer 200 and the charge transport layer 300, and electrical energy is generated as the electrons and holes move.

For example, when a vertical force is applied to the energy harvesting system according to the present application (refer to FIG. 3), the crystal structure of the perovskite layer 200 may be changed, electrons and holes may be generated in the perovskite layer 200, and electrical energy may be generated as the electrons and holes move (piezoelectric and electrostrictive effects).

FIG. 5 is a conceptual diagram for one-way transport of a carrier in an energy harvesting system according to an embodiment of the present application.

Referring to FIG. 5, the generation of electrical energy may be confirmed by the piezoelectric effect through a force vertically applied to the perovskite layer, and the fact that it is possible to operate the energy harvesting system according to the present application also through the vertically applied force may be understood through this.

In detail, since separation and restoration between X—Pb—X occurred by applying a vertical force, the piezoelectric effect may generate electrical energy through this.

In this regard, although the amount of electrical energy generated depending on the thickness of the perovskite layer may be adjusted in an energy harvesting system according to an embodiment of the present application, the present application is not limited thereto.

In the energy harvesting system, according to the present application, the higher the concentration of the carrier, the more the performance is improved.

According to an embodiment of the present application, although the perovskite layer 200 may include a material represented by the following Chemical Formula 1 or Chemical Formula 2, the present application is not limited thereto:

$$ABX_3 \quad \text{[Chemical Formula 1]}$$

$$A_2BX_4 \quad \text{[Chemical Formula 2]}$$

In Chemical Formula 1 and Chemical Formula 2,

A is a $C_1$-$C_{24}$ substituted or unsubstituted alkyl group. When A is substituted, the substituent is an amino group, a hydroxyl group, a cyano group, a halogen group, a nitro group, or a methoxy group, B includes a metal cation selected from the group consisting of Pb, Bi, Sn, Ge, Cu, Ni, Co, Fe, Mn, Cr, Pd, Cd, Yb, and combinations thereof, and although X may include a halide anion or a chalcogenide anion, the present application is not limited thereto.

According to an embodiment of the present application, although the amount of electrical energy generated depending on a work function difference between the perovskite layer 200 and the charge transport layer 300 may be adjusted, the present application is not limited thereto.

As the work function difference between the perovskite layer 200 and the charge transport layer 300 increases, high voltage output is possible.

According to the present application, the magnitude of the work function difference in the energy harvesting system is related to the magnitude of the voltage generated by a sliding motion.

In this regard, the work function level may vary depending on the composition of the perovskite layer 200. Accordingly, a work function difference between the perovskite layer 200 and the charge transport layers 300 may occur by adjusting the composition of the perovskite layer 200.

Further, although the amount of electrical energy generated depending on the thickness of the perovskite layer 200 may be adjusted in the energy harvesting system according to the present application, the present application is not limited thereto.

In this regard, when the heterojunction of the perovskite layer 200 and the charge transport layer 300 forms an appropriate band alignment, carrier transport may be properly separated.

According to an embodiment of the present application, although the first substrate 100 and the second substrate 400 each independently may include one selected from the group consisting of glass, $SiO_2$, ITO, FTO, Si, SiC, Ga, SiGe, $Al_2O_3$, InAs, GaAs, InP, GaN, InGaAs, InAlAs, GaSb, AlSb, AlP, GaP, $Ge_2O_3$, and combinations thereof, the present application is not limited thereto.

The first substrate 100 and/or the second substrate 400 may act as an electrode for collecting collected electrical energy. Further, when the first substrate 100 and/or the second substrate 400 is transparent, light may be irradiated to the energy harvesting system according to the present application to perform a function as a solar cell.

According to an embodiment of the present application, although the charge transport layer 300 may include one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof, the present application is not limited thereto.

According to the present application, the energy harvesting system may stably output a constant voltage even if the mechanical force is repeatedly and continuously applied.

A second aspect of the present application provides a method for manufacturing an energy harvesting system, the method including the operations of forming a perovskite layer 200 on a first substrate 100, forming a charge transport layer 300 on a second substrate 400, and disposing the charge transport layer 300 on the perovskite layer 200.

With respect to the method for manufacturing the energy harvesting system according to the second aspect of the present application, although detailed descriptions of parts overlapping with the first aspect of the present application have been omitted, the contents described in the first aspect of the present application may be equally applied to the second aspect of the present application even if the descriptions have been omitted.

FIG. 6 is a flowchart of a method for manufacturing an energy harvesting system according to an embodiment of the present application.

First, a perovskite layer 200 is formed on a first substrate (S100).

According to an embodiment of the present application, although the operation of forming the perovskite layer 200 may be performed by a method selected from the group consisting of spin coating, bar coating, inkjet printing, nozzle printing, spray coating, slot die coating, gravure printing, screen printing, electrohydrodynamic jet printing, electrospray, and combinations thereof, the present application is not limited thereto.

Subsequently, the charge transport layer 300 is formed on the second substrate (S200).

According to an embodiment of the present application, although the operation of forming the charge transport layer 300 may be performed by a method selected from the group consisting of spin coating, bar coating, inkjet printing, nozzle printing, spray coating, slot die coating, gravure printing, screen printing, electrohydrodynamic jet printing, electrospray, and combinations thereof, the present application is not limited thereto.

Subsequently, the charge transport layer 300 is disposed on the perovskite layer 200 (S300).

A third aspect of the present application provides a perovskite solar cell, including the energy harvesting system according to the first aspect of the present application.

As described above, when the first substrate 100 and/or the second substrate 400 is a transparent substrate, the energy harvesting system may be used as a perovskite solar cell, and at this time, as sunlight irradiated to the solar cell is transmitted through a transparent substrate (electrode) and absorbed by the perovskite layer 200 to generate electrons, electrical energy may be generated.

With respect to the perovskite solar cell according to the third aspect of the present application, although detailed descriptions of parts overlapping with the first aspect and/or the second aspect of the present application have been omitted, the contents described in the first aspect and/or the second aspect of the present application may be equally applied to the third aspect of the present application even if the descriptions have been omitted.

Hereinafter, although the present disclosure will be described in more detail through Embodiments, the following Embodiments are for illustrative purposes only and are not intended to limit the scope of the present application.

A perovskite layer having a thickness of about 600 nm was formed on an FTO glass as the first substrate by an anti-solvent dropping method, i.e., a type of spin coating using a solution obtained by dissolving an $FAPbI_3$ powder in a mixed solvent of dimethylformamide (DMF) and N-methyl-2-pyrrolidone (NMP). Subsequently, after forming a charge transport layer on an FTO glass as a second substrate by a spin coating method using a solution obtained by dissolving Spiro-MeOTAD powder together with Li-TFSI and 4-tert-butylpyridine (tBP) additives in a chlorobenzene solvent, an energy harvesting system was manufactured by disposing the charge transport layer so that the perovskite layer and the charge transport layer face with each other. Three types of energy harvesting systems, including different perovskite materials ($FAPbI_3$, $MAPbI_3$, and $MAPbBr_3$) were additionally manufactured in the same manner by changing the materials.

FIG. 7A is an XRD analysis result of the perovskite layer according to an embodiment of the present application. FIG. 7B is an SEM image of the perovskite layer according to an embodiment of the present application. FIG. 7C is a dark current-voltage curve obtained by performing a static PN junction of the perovskite layer and the charge transport layer in an energy harvesting system according to an embodiment of the present application.

Referring to FIG. 7A, it may be confirmed that the perovskite layer exhibits strong reflection peaks at the (110) peak and the (220) peak, indicating a pure phase and a high crystalline phase.

Referring to FIG. 7B, it may be seen that the perovskite layer has a uniform grain size and excellent coverage. The dark current-voltage curve data were measured by inducing electrical connection while applying pressure to the perovskite layer and the charge transport layer.

Referring to FIG. 7C, it may be confirmed that the junction of the perovskite layer and the charge transport layer shows a nonlinear curve having a rectifying effect caused by the PN junction.

Experimental Embodiment 1

The energy output was analyzed by applying a sliding movement to an energy harvesting system according to an embodiment of the present application.

FIG. 8 is a dark current-voltage curve graph of the dynamic movement and the static state of an energy harvesting system according to an embodiment of the present application.

FIG. 9 is a graph for the dynamic current output of an energy harvesting system according to an embodiment of the present application.

Referring to FIGS. 8 and 9, it may be confirmed that a voltage of about 0.4 v is output by antagonistic sliding movements. The carrier is transported in one direction through the PN junction so that a direct current rather than an alternating current may be continuously generated.

Experimental Embodiment 2

The energy output was analyzed by applying pressure to an energy harvesting system according to an embodiment of the present application.

FIG. 10 is a graph for the dynamic voltage output of an energy harvesting system according to an embodiment of the present application. FIG. 11 is a graph for the dynamic current output of an energy harvesting system according to an embodiment of the present application.

Through FIGS. 10 and 11, it may be confirmed that a direct current rather than an alternating current may be continuously generated through the PN junction by a repeated contact movement (pressure).

Experimental Embodiment 3

According to the embodiment of the present application, voltage outputs depending on the type of a perovskite material and the magnitude of an applied force in an energy harvesting system were compared.

FIG. 12 shows the level of an electron energy band of the perovskite layer included in an energy harvesting system according to an embodiment of the present application.

Referring to FIG. 12, considering that the highest voltage output of 0.4 V occurs in $FAPbI_3$, and the DC voltage output, which is eight times that of $MAPbI_3$, which has a similar overall energy band level, is generated, it may be seen that the PN junction (difference in band level) is not a factor for adjusting the degree of energy output.

FIG. 13 is a diagram illustrating a distance between X—Pb—X through XRD data analysis of an energy harvesting system according to an embodiment of the present application.

Referring to FIG. 13, it may be seen that the order of the magnitude of the DC voltage output has the same tendency as the order of the magnitude of the separation distance between X—Pb—X and the order of the magnitude of the piezoelectric effect so that the piezoelectric effect contributes to the voltage output accordingly.

Specifically, polarizations of $FAPbI_3$ and $MAPbI_3$ were calculated to be 63 $\mu C\ cm^{-2}$ and 38 $\mu C\ cm^{-2}$ respectively. The higher polarization degree in $FAPbI_3$ is attributed to the larger FA size, which may induce strong deformation of the $PbI_3$ inorganic structure. Further, it is confirmed that the piezoelectric coefficient is dramatically decreased by replacing r with a Br halide anion, which may be explained by the simultaneous decrease in the Pb—X bond with the replacement of the halide anion. Therefore, the piezoelectric properties are confirmed to follow the trend of $FAPbI_3 > MAPbI_3 > MAPbBr_3$, which is the same trend as the voltage output. To confirm the results mentioned above, the X—Pb—X length was calculated based on the XRD results.

FIG. 14 is a diagram illustrating a voltage output at a perovskite layer/charge transport layer junction depending on a force applied in an energy harvesting system according to an embodiment of the present application.

Referring to FIG. 14, it may be seen that as the force applied increases, the output magnitude of the continuously generated constant DC voltage also increases, and the possibility of its use is confirmed.

Experimental Embodiment 4

According to an embodiment of the present application, voltage outputs for the same force application depending on the thickness adjustment of the perovskite layer of an energy harvesting system were compared.

FIGS. 15 to 18 are SEM images depending on thicknesses (50/100/250/600 nm in order) of the perovskite layers of an energy harvesting system according to an embodiment of the present application.

FIG. 19 is a diagram illustrating a voltage output depending on the thickness of the perovskite layer when the same force is applied in an energy harvesting system according to an embodiment of the present application.

Referring to FIGS. 15 to 19, it is confirmed that a voltage output of up to 0.4 V at a thickness of 600 nm may be realized depending on the adjustment of the magnitude of the force. It may be seen that the desired voltage output for a specifically applied force may be adjusted.

Experimental Embodiment 5

A long-term driving stability test was performed on an energy harvesting system according to an embodiment of the present application.

FIG. 20 is a long-term driving stability test result of an energy harvesting system according to an embodiment of the present application.

Referring to FIG. 20, it is confirmed that the same voltage is output when a constant mechanical force is repeatedly and continuously applied for 4,000 seconds. That is, the possibility of realizing a sustainable and stable element may be confirmed.

Experimental Embodiment 6

Carrier concentrations and carrier mobility according to the perovskite materials ($FAPbI_3$, $MAPbI_3$, and $MAPbBr_3$) used in the Embodiment of the present application were compared.

TABLE 1

| Materials | Carrier concentration ($10^{16}\ m^{-3}$) | carrier mobility ($10^{-2}\ m^2/Vs$) |
|---|---|---|
| $FAPbI_3$ | 1.5 | 5.5 |
| $MAPbI_3$ | 4.8 | 6.4 |
| $MAPbBr_3$ | 0.44 | 6.2 |

Referring to Table 1, it may be confirmed that $FAPbI_3$, $MAPbI_3$, and $MAPbBr_3$ have similar degrees of hole mobility, whereas carrier concentrations of $FAPbI_3$ and $MAPbI_3$ are 3 times and 10 times higher than that of $MAPbBr_3$, respectively. That is, it may be seen that a high voltage and a high current may be obtained when the carrier concentration is high.

Experimental Embodiment 7

Under light, an energy harvesting system according to an embodiment of the present application exhibits the effects of photovoltaic and triboelectric at the same time.

FIG. 21 is a schematic diagram of charge transfer during frictional motion on an energy harvesting system under light according to an embodiment of the present application.

Referring to FIG. 21, Charges are separated in the perovskite layer by the photovoltaic effect, and charges are separated at the interface between the perovskite and the charge transport layer by the triboelectric effect. The separated charges selectively move electrons to the N-type layer (right) and holes to the P-type layer (left) at the PN junction.

The photovoltaic effect and the triboelectric effect overlap by the coupling effect, resulting in higher current and voltage output than the dark state.

FIG. 22 is a current-voltage curve graph of the dynamic movement and the static state of an energy harvesting system under light according to an embodiment of the present application.

Referring to FIG. 22, it may be confirmed that a voltage of about 0.95 V is output by antagonistic sliding movements in the presence of light, and about 0.70 V is output in a static state in the presence of light. The carrier is transported in one direction through the PN junction so that a direct current rather than an alternating current may be continuously generated (the current of the dynamic device under light is about 600 $\mu A$ with sliding movement and about 200 $\mu A$ at static state). The aforementioned description of the present application is for illustration purposes; and those with ordinary skill in the art to which the present application pertains will be able to understand that the present application may be easily modified into other specific forms without changing technical ideas or essential features of the present application. Accordingly, the embodiments described above are examples in all aspects and should be understood not to be limited. For example, each constituent element described as a single form may also be dispersed and implemented, and similarly, constituent elements described as dispersed may also be implemented in a combined form.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An energy harvesting system for generating electrical energy, the energy harvesting system comprising:
   a first substrate;
   a perovskite layer formed on the first substrate;
   a charge transport layer disposed on the perovskite layer, and the charge transport layer being separably disposed above the perovskite layer and configured to slide over the perovskite layer in a direction parallel to a surface of the perovskite layer; and
   a second substrate formed on the charge transport layer.

2. The energy harvesting system of claim 1, wherein the perovskite layer and the charge transport layer form a PN junction.

3. The energy harvesting system of claim 1, wherein the electrical energy is generated by friction occurring as the perovskite layer slides over the charge transport layer.

4. An energy harvesting system for generating electrical energy, the energy harvesting system comprising:
   a first substrate;
   a perovskite layer formed on the first substrate;
   a charge transport layer disposed on the perovskite layer, the charge transport layer being separably disposed above the perovskite layer and configured to slide over the perovskite layer in a direction parallel to a surface of the perovskite layer; and
   a second substrate formed on the charge transport layer, wherein the electrical energy is generated by pressure applied vertically on the perovskite layer and the charge transport layer.

5. The energy harvesting system of claim 4, wherein the electrical energy is generated as the perovskite layer's crystal structure is changed by the pressure.

6. The energy harvesting system of claim 1, wherein the perovskite layer comprises a material having a chemical formula of $ABX_3$ or $A_2BX_4$, where
   A is a $C_1$-$C_{24}$ substituted or unsubstituted alkyl group, and when the A is substituted, the substituent is an amino group, a hydroxyl group, a cyano group, a halogen group, a nitro group, or a methoxy group,
   B includes a metal cation selected from the group consisting of Pb, Bi, Sn, Ge, Cu, Ni, Co, Fe, Mn, Cr, Pd, Cd, Yb, and combinations thereof, and
   X includes a halide anion or a chalcogenide anion.

7. The energy harvesting system of claim 1, wherein an amount of the electrical energy generated, depending on a work function difference between the perovskite layer and the charge transport layer, is adjustable.

8. The energy harvesting system of claim 1, wherein an amount of electrical energy generated, depending on a thickness of the perovskite layer, is adjustable.

9. The energy harvesting system of claim 1, wherein each of the first substrate and the second substrate comprises one selected from the group consisting of glass, $SiO_2$, ITO, FTO, Si, SiC, Ga, SiGe, $Al_2O_3$, InAs, GaAs, InP, GaN, InGaAs, InAlAs, GaSb, AlSb, AlP, GaP, $Ge_2O_3$, and combinations thereof.

10. The energy harvesting system of claim 1, wherein the charge transport layer comprises one selected from the group consisting of Spiro-OMeTAD, PEDOT:PSS, G-PEDOT, PANI:PSS, PANI:CSA, PDBT, P3HT, PCPDTBT, PCDTBT, PTAA, $MoO_3$, $V_2O_5$, NiO, $WO_3$, CuI, CuSCN, and combinations thereof.

11. A perovskite solar cell comprising the energy harvesting system of claim 1.

* * * * *